United States Patent

Patwardhan et al.

(10) Patent No.: US 9,509,267 B2
(45) Date of Patent: Nov. 29, 2016

(54) METHOD AND AN APPARATUS FOR AUTOMATIC VOLUME LEVELING OF AUDIO SIGNALS

(71) Applicant: Nokia Technologies Oy, Espoo (FI)

(72) Inventors: Pushkar Prasad Patwardhan, Maharashtra (IN); Ravi Shenoy, Bangalore (IN)

(73) Assignee: Nokia Technologies Oy, Espoo (FI)

( * ) Notice: Subject to any disclaimer, the term of this patent is extended or adjusted under 35 U.S.C. 154(b) by 42 days.

(21) Appl. No.: 14/356,678

(22) PCT Filed: Oct. 31, 2012

(86) PCT No.: PCT/FI2012/051057
§ 371 (c)(1),
(2) Date: May 7, 2014

(87) PCT Pub. No.: WO2013/068637
PCT Pub. Date: May 16, 2013

(65) Prior Publication Data
US 2014/0328500 A1 Nov. 6, 2014

(30) Foreign Application Priority Data

Nov. 8, 2011 (IN) .......................... 3805/CHE/2011

(51) Int. Cl.
*H03G 3/20* (2006.01)
*H03G 3/30* (2006.01)
*H03G 3/32* (2006.01)
*H03G 5/16* (2006.01)
*G10L 21/034* (2013.01)
*H03G 5/00* (2006.01)
*H04N 21/439* (2011.01)
*H04N 5/60* (2006.01)

(52) U.S. Cl.
CPC .......... *H03G 3/3005* (2013.01); *G10L 21/034* (2013.01); *H03G 3/20* (2013.01); *H03G 3/32* (2013.01); *H03G 5/005* (2013.01); *H03G 5/16* (2013.01); *H03G 5/165* (2013.01); *H04N 21/439* (2013.01); *H04N 21/4394* (2013.01); *H04N 5/60* (2013.01)

(58) Field of Classification Search
None
See application file for complete search history.

(56) References Cited

U.S. PATENT DOCUMENTS

| | | | |
|---|---|---|---|
| 7,072,477 B1 | 7/2006 | Kincaid | |
| 7,272,235 B2 | 9/2007 | Lu et al. | |
| 7,756,280 B2 | 7/2010 | Hsieh et al. | |
| 7,848,531 B1 | 12/2010 | Vickers et al. | |
| 8,660,677 B2 * | 2/2014 | Theimer et al. | 700/94 |
| 2005/0147004 A1 * | 7/2005 | Kumagai et al. | 369/47.19 |
| 2006/0106472 A1 | 5/2006 | Romesburg et al. | |
| 2006/0153405 A1 | 7/2006 | Myers | |

(Continued)

OTHER PUBLICATIONS

International Search Report received for corresponding Patent Cooperation Treaty Application No. PCT/FI2012/051057, dated Feb. 5, 2013, 5 pages.

(Continued)

*Primary Examiner* — Andrew L Sniezek
(74) *Attorney, Agent, or Firm* — Alston & Bird LLP

(57) ABSTRACT

There is provided a method for audio signal adjustment comprising: determining a loudness estimate for at least one frame of an audio signal; determining a level value for the at least one frame based on the loudness estimate; and adjusting the audio signal based on the level value. An apparatus for carrying out the method is also provided.

20 Claims, 14 Drawing Sheets

(56) References Cited

U.S. PATENT DOCUMENTS

| | | |
|---|---|---|
| 2007/0291959 A1 | 12/2007 | Seefeldt |
| 2009/0161883 A1 | 6/2009 | Katsianos |
| 2009/0274322 A1 | 11/2009 | Chang et al. |
| 2010/0150379 A1 | 6/2010 | Craig et al. |
| 2011/0019839 A1 | 1/2011 | Nandury |
| 2011/0021241 A1 | 1/2011 | Khanduri |
| 2011/0228953 A1 | 9/2011 | Hess |

OTHER PUBLICATIONS

International Preliminary Report on Patentability and Written Opinion from International Patent Application No. PCT/FI2012/051057 dated May 13, 2014.

ReplayGain [online] [retrieved Dec. 22, 2015]. Retrieved from the Internet: <URL: https://en.wikipedia.org/wiki/ReplayGain>. 6 pages.

* cited by examiner

METHOD AND AN APPARATUS FOR AUTOMATIC VOLUME LEVELING OF AUDIO SIGNALS

RELATED APPLICATION

This application was originally filed as PCT Application No. PCT/FI2012/051057 filed Oct. 31, 2012, which claims priority benefit to Indian Patent Application No. 3805/CHE/2011, filed Nov. 8, 2011.

FIELD OF THE APPLICATION

The present invention relates to apparatus for processing of audio signals. The invention further relates to, but is not limited to, apparatus for processing audio in audio playback devices.

BACKGROUND OF THE APPLICATION

Typically an audio or media player will contain a wide range of various audio and video tracks or files. These tracks can be collected from various sources such as being purchased or downloaded from websites, ripped from CD's or audio tracks, or shared from friends. Due to the diverse nature of sourcing tracks and the unknown recording and content conditions the user is likely to experience a wide range or disparity in the perceived volume or loudness level during playback of various audio tracks. This wide range of loudness levels can be unpleasant for the user as they have to manually adjust the volume for each track. Furthermore in some circumstances the wide range of loudness can cause a psycho-acoustical shock where the volume level increase is significant to cause temporary shock to the user.

Since audio files on such audio and media players are typically stored in a compressed format the audio player is unlikely to attempt to normalise the signal level before playback or insertion into a playlist or queue due to the processing required unless specific measures are taken such as provision of additional metadata about the volume or loudness information.

SUMMARY OF SOME EMBODIMENTS

There is provided according to a first aspect of the application a method for audio signal adjustment comprising: determining a loudness estimate for at least one frame of an audio signal; determining a level value for the at least one frame based on the loudness estimate; and adjusting the audio signal based on the level value.

The method may further comprise determining a desired level, and wherein adjusting the audio signal is further based on the desired level.

Determining a desired level may comprise at least one of: receiving a desired level from a user interface input; determining a desired level from a selected audio signal; and receiving a desired level from a memory.

Adjusting the audio signal may comprise normalising the audio signal to the desired level.

Adjusting the audio signal may comprise normalising the audio signal without metadata.

Determining a loudness estimate for at least one frame of an audio signal may be performed avoiding the use of complicated loudness modelling.

Determining a loudness estimate for the at least one frame of an audio signal may comprise:

determining at least one historical loudness estimate; determining a first frame loudness estimate; comparing the first frame loudness estimate against the at least one historical loudness estimate; and selecting one of the first frame loudness estimate and the at least one historical loudness estimate dependent on the comparison.

Determining the loudness estimate may further comprise applying a low pass filter to the selected one of the first frame loudness estimate and the at least one historical loudness estimate.

Comparing the first frame loudness estimate against at least one historical loudness estimate may comprise: generating an estimate of the distribution model dependent on the at least one historical loudness estimate; determining whether the first frame loudness estimate fits within the estimate distribution model; and wherein selecting one of the first frame loudness estimate and the at least one historical loudness estimate dependent on the comparison further comprises: selecting the first frame loudness estimate when the first frame loudness estimate fits within the estimate distribution model; and selecting the at least one historical frame loudness estimate when the first frame loudness estimate fails to fit the estimate distribution model.

Determining at least one historical loudness estimate may comprise selecting at least one preceding frame loudness estimate.

Determining at least one first frame loudness estimate may comprise: generating at least two frequency band energy values from the at least one first frame audio signal; applying a regression coefficient to each of the at least two frequency band energy values; and combining the regression coefficient modified at least two frequency band audio signals to generate a first frame loudness estimate.

The method may further comprise: determining at least one criteria of the at least one first frame audio signal; and determining a regression coefficient dependent on the at least one criteria of the at least one first frame audio signal.

Generating the at least two frequency band energy values from the first frame audio signal may comprise: determining a normalised sum of each band audio signals; and processing the normalised sum of each band audio signal to generate each frequency band energy value.

Processing the normalised sum of each band audio signal to generate each frequency band energy value may comprise one of: log processing the squared sum of each band audio signal; and Box-Cox transforming the squared sum of each band audio signal.

The method may further comprise generating at least two frequency band signals from the at least one first frame audio signal, wherein generating at least two frequency band signals may include: all pass filtering the at least one first frame audio signal with a warping factor; and band pass filtering the all pass filtered at least one first frame audio signal to generate the at least two frequency band signals from the at least one first frame audio signal.

Adjusting the audio signal based on the level value may further comprise normalising the audio signal by the level value such that the audio signal is within a desired volume range.

The level value may be a gain value applied by an amplifier.

According to a second aspect there is provided an apparatus comprising: at least one processor and at least one memory including computer code for one or more programs, the at least one memory and the computer code configured to with the at least one processor cause the apparatus to at least perform: determining a loudness estimate for at least one frame of an audio signal; determining a level value for the at least one frame based on the loudness estimate; and adjusting the audio signal based on the level value.

The apparatus may be caused to perform determining a desired level, and wherein adjusting the audio signal is further based on the desired level.

Determining a desired level may cause the apparatus to perform at least one of: receiving a desired level from a user interface input; determining a desired level from a selected audio signal; and receiving a desired level from a memory.

Adjusting the audio signal may cause the apparatus to normalise the audio signal to the desired level.

Adjusting the audio signal may cause the apparatus to normalise the audio signal without metadata.

Determining a loudness estimate for at least one frame of an audio signal may be performed avoiding the use of complicated loudness modelling.

Determining a loudness estimate for the at least one frame of an audio signal may cause the apparatus to perform: determining at least one historical loudness estimate; determining a first frame loudness estimate; comparing the first frame loudness estimate against the at least one historical loudness estimate; and selecting one of the first frame loudness estimate and the at least one historical loudness estimate dependent on the comparison.

Determining the loudness estimate may further cause the apparatus to perform applying a low pass filter to the selected one of the first frame loudness estimate and the at least one historical loudness estimate.

Comparing the first frame loudness estimate against at least one historical loudness estimate may cause the apparatus to perform: generating an estimate of the distribution model dependent on the at least one historical loudness estimate; determining whether the first frame loudness estimate fits within the estimate distribution model; and wherein selecting one of the first frame loudness estimate and the at least one historical loudness estimate dependent on the comparison may cause the apparatus to perform: selecting the first frame loudness estimate when the first frame loudness estimate fits within the estimate distribution model; and selecting the at least one historical frame loudness estimate when the first frame loudness estimate fails to fit the estimate distribution model.

Determining at least one historical loudness estimate may cause the apparatus to perform selecting at least one preceding frame loudness estimate.

Determining at least one first frame loudness estimate may cause the apparatus to perform: generating at least two frequency band energy values from the at least one first frame audio signal; applying a regression coefficient to each of the at least two frequency band energy values; and combining the regression coefficient modified at least two frequency band audio signals to generate a first frame loudness estimate.

The apparatus may further perform: determining at least one criteria of the at least one first frame audio signal; and determining a regression coefficient dependent on the at least one criteria of the at least one first frame audio signal.

Generating the at least two frequency band energy values from the first frame audio signal may cause the apparatus to perform: determining a normalised sum of each band audio signals; and processing the normalised sum of each band audio signal to generate each frequency band energy value.

Processing the normalised sum of each band audio signal to generate each frequency band energy value may cause the apparatus to perform only one of the following log processing the squared sum of each band audio signal; Box-Cox transforming the squared sum of each band audio signal.

The apparatus may be caused to perform generating at least two frequency band signals from the at least one first frame audio signal, wherein generating at least two frequency band signals may include: all pass filtering the at least one first frame audio signal with a warping factor; and band pass filtering the all pass filtered at least one first frame audio signal to generate the at least two frequency band signals from the at least one first frame audio signal.

Adjusting the audio signal based on the level value may cause the apparatus to perform normalising the audio signal by the level value such that the audio signal is within a desired volume range.

The level value may be a gain value applied by an amplifier.

According to a third aspect there is provided an apparatus comprising: means for determining a loudness estimate for at least one frame of an audio signal; means for determining a level value for the at least one frame based on the loudness estimate; and means for adjusting the audio signal based on the level value.

The apparatus may comprise means for determining a desired level, and wherein the means for adjusting the audio signal is further based on the desired level.

The means for determining a desired level may comprise at least one of: means for receiving a desired level from a user interface input; means for determining a desired level from a selected audio signal; and means for receiving a desired level from a memory.

The means for adjusting the audio signal may comprise means for normalising the audio signal to the desired level.

The means for adjusting the audio signal may comprise normalising the audio signal without metadata.

The means for determining a loudness estimate for at least one frame of an audio signal may avoid the use of complicated loudness modelling.

The means for determining a loudness estimate for the at least one frame of an audio signal may comprise: means for determining at least one historical loudness estimate; determining a first frame loudness estimate; means for comparing the first frame loudness estimate against the at least one historical loudness estimate; and means for selecting one of the first frame loudness estimate and the at least one historical loudness estimate dependent on the comparison.

The means for determining the loudness estimate may further comprise means for applying a low pass filter to the selected one of the first frame loudness estimate and the at least one historical loudness estimate.

The means for comparing the first frame loudness estimate against at least one historical loudness estimate may comprise: means for generating an estimate of the distribution model dependent on the at least one historical loudness estimate; means for determining whether the first frame loudness estimate fits within the estimate distribution model; and wherein the means for selecting one of the first frame loudness estimate and the at least one historical loudness estimate dependent on the comparison comprises: means for selecting the first frame loudness estimate when the first frame loudness estimate fits within the estimate distribution model; and means for selecting the at least one historical frame loudness estimate when the first frame loudness estimate fails to fit the estimate distribution model.

The means for determining at least one historical loudness estimate may comprise means for selecting at least one preceding frame loudness estimate.

The means for determining at least one first frame loudness estimate may comprise: means for generating at least two frequency band energy values from the at least one first frame audio signal; means for applying a regression coefficient to each of the at least two frequency band energy values; and means for combining the regression coefficient modified at least two frequency band audio signals to generate a first frame loudness estimate.

The apparatus may comprise: means for determining at least one criteria of the at least one first frame audio signal; and means for determining a regression coefficient dependent on the at least one criteria of the at least one first frame audio signal.

The means for generating the at least two frequency band energy values from the first frame audio signal may comprise: means for determining a normalised sum of each band audio signals; and means for processing the normalised sum of each band audio signal to generate each frequency band energy value.

The means for processing the normalised sum of each band audio signal to generate each frequency band energy value may comprise means for log processing the normalised sum of each band audio signal.

The apparatus may further comprise means for generating at least two frequency band signals from the at least one first frame audio signal, wherein the means for generating at least two frequency band signals may include: means for all pass filtering the at least one first frame audio signal with a warping factor; and means for band pass filtering the all pass filtered at least one first frame audio signal to generate the at least two frequency band signals from the at least one first frame audio signal.

The means for adjusting the audio signal based on the level value may further comprise means for normalising the audio signal by the level value such that the audio signal is within a desired volume range.

The level value may be a gain value applied by an amplifier.

According to a fourth aspect there is provided an apparatus comprising: a loudness estimator configured to determine a loudness estimate for at least one frame of an audio signal; a level determiner configured to determine a level value for the at least one frame based on the loudness estimate; and an audio signal adjuster configured to adjust the audio signal based on the level value.

The apparatus may further comprise a desired level determiner configured to determine a desired level, and wherein the audio signal adjuster is configured to adjust the audio signal further based on the desired level.

The desired level determiner may comprise at least one of: an input configured to receive a desired level from a user interface input; an audio signal desired level determiner configured to determine a desired level from a selected audio signal; and an input configured to receive a desired level from a memory.

The audio signal adjuster may comprise a normaliser configured to normalise the audio signal to the desired level.

The audio signal adjuster may comprise a normaliser configured to normalise the audio signal without metadata.

The loudness estimator is configured to avoid the use of complicated loudness modelling.

The loudness estimator may comprise: a memory configured to store at least one historical loudness estimate; a frame loudness estimator configured to determine a first frame loudness estimate; a comparator configured to compare the first frame loudness estimate against the at least one historical loudness estimate; and a gain selector configured to select one of the first frame loudness estimate and the at least one historical loudness estimate dependent on the comparison.

The frame loudness estimator may further comprises a low pass filter configured to low pass filter the selected one of the first frame loudness estimate and the at least one historical loudness estimate.

The comparator may further comprise: a model generator configured to generate an estimate distribution model dependent on the at least one historical loudness estimate; a hypothesis tester configured to determine the first frame loudness estimate fits within the estimate distribution model; and wherein the gain selector is configured to select the first frame loudness estimate when the first frame loudness estimate fits within the estimate distribution model; and select the at least one historical frame loudness estimate when the first frame loudness estimate fails to fit the estimate distribution model.

The apparatus may comprise a histogram determiner configured to determine at least one preceding frame loudness estimate.

The frame loudness estimator may comprise: an energy determiner configured to generate at least two frequency band energy values from the at least one first frame audio signal; a multiplier configured to apply a regression coefficient to each of the at least two frequency band energy values; and a combiner configured to combine the regression coefficient modified at least two frequency band audio signals to generate a first frame loudness estimate The apparatus may further comprise: a criteria determiner configured to determine at least one criteria of the at least one first frame audio signal; and a regression coefficient determiner configured to determine a regression coefficient dependent on the at least one criteria of the at least one first frame audio signal.

The energy determiner may comprise: a processer configured to determine a normalised sum of each band audio signals; and an energy distribution processor configured to process the normalised sum of each band audio signal to generate each frequency band energy value.

The energy distribution processor may comprise one of: a log processor configured to log process the normalised sum of each band audio signal; and Box-Cox processor configured to Box-Cox transform the normalised sum of each band audio signal.

The apparatus may comprise: an all pass filter configured to all pass filter the at least one first frame audio signal with a warping factor; and at least one band pass filter configured to band pass filter the all pass filtered at least one first frame audio signal to generate the at least two frequency band signals from the at least one first frame audio signal.

The audio signal adjuster may comprise a normaliser configured to normalise the audio signal by the level value such that the audio signal is within a desired volume range.

The level value may be a gain value applied by an amplifier.

A computer program product may be stored on a medium for causing an apparatus to perform the method as discussed herein.

An electronic device may comprise apparatus as discussed herein.

A chipset may comprise apparatus as discussed herein.

An apparatus configured to perform the method as discussed herein.

A method substantially as herein described and illustrated in the accompanying drawings.

An apparatus substantially as herein described and illustrated in the accompanying drawings.

A computer program product comprising program instructions to cause an apparatus to perform method discussed herein.

BRIEF DESCRIPTION OF DRAWINGS

For better understanding of the present application, reference will now be made by way of example to the accompanying drawings in which.

SOME EMBODIMENTS OF THE APPLICATION

Figure 1:
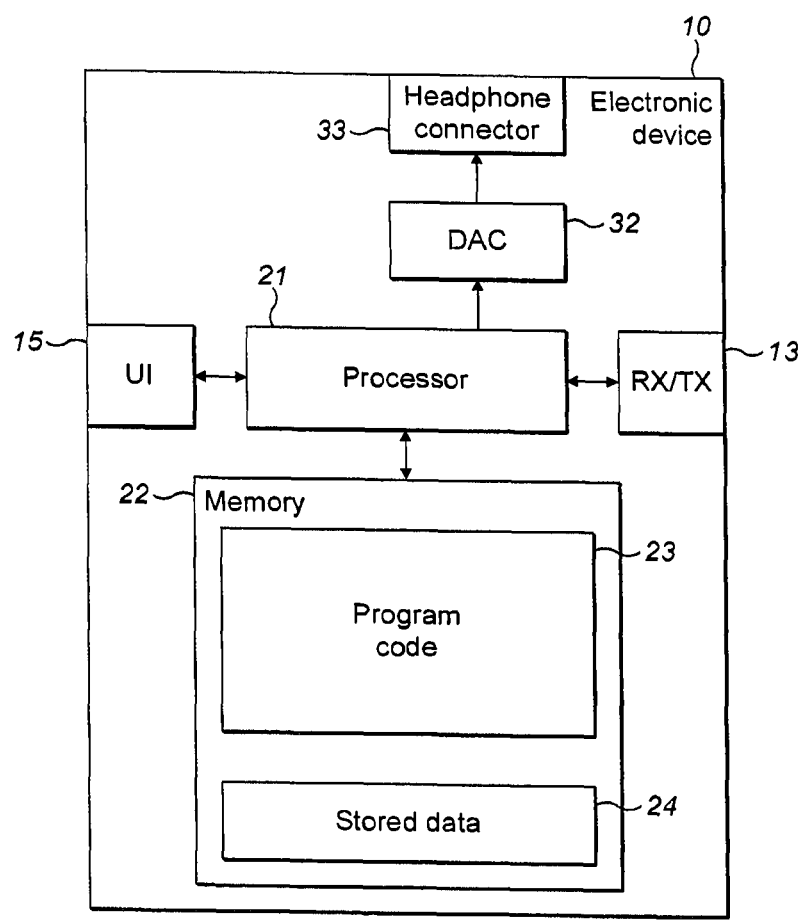
FIG. 1 shows schematically an electronic device employing embodiments of the application.

The following describes apparatus and methods for the provision of enhancing automatic volume levelling. In this regard reference is first made to FIG. 1 schematic block diagram of an exemplary electronic device 10 or apparatus, which may incorporate automatic volume levelling.

The electronic apparatus 10 can for example be a mobile terminal or user equipment for a wireless communication system. In other embodiments the electronic device may be a Television (TV) receiver, portable digital versatile disc (DVD) player, a digital media player or audio player. In some embodiments the electronic apparatus can also operate in an 'offline' mode. For example in some embodiments the electronic apparatus can be a server operating on a database of audio samples. In some embodiments the audio samples could be an album stored by a cloud or online music hosting service and wherein the electronic apparatus being a cloud or online music hosting server.

The electronic device 10 comprises in some embodiments a processor 21 which can be linked via a digital-to-analogue converter 32 to a headphone connector for receiving a headphone or headset 33. The processor 21 is further linked to a transceiver (TX/RX) 13, to a user interface (UI) 15 and to a memory 22.

The processor 21 may be configured to execute various program codes. The implemented program codes can in some embodiments comprise automatic volume levelling. The implemented program codes 23 may be stored for example in the memory 22 for retrieval by the processor 21 whenever needed. The memory 22 could further provide a section 24 for storing data, for example data that has been processed in accordance with the embodiments.

The automatic volume levelling can in some embodiments be implemented at least partially in hardware or firmware.

The user interface 15 enables a user to input commands to the electronic apparatus 10, for example via a keypad, and/or to obtain information from the electronic apparatus 10, for example via a display. The transceiver 13 enables a communication with other electronic apparatus, for example via a wireless communication network.

It is to be understood again that the structure of the electronic apparatus 10 could be supplemented and varied in many ways.

The apparatus 10 can in some embodiments process audio signal data stored on memory or in some embodiments also receive a bit stream with correspondingly encoded audio data for automatic volume levelling from another electronic apparatus via the transceiver 13. In these embodiments, the processor 21 can execute the automatic volume levelling program code stored in the memory 22. The processor 21 in these embodiments can then process the received audio signal data, and output the normalized audio signal.

The received stereo audio data may in some embodiments also be stored, instead of being processed immediately, in the data section 24 of the memory 22, for instance for enabling a later processing and presentation or forwarding to still another electronic apparatus.

In some embodiments the headphone connector 33 may be configured to communicate to a headphone set or earplugs wirelessly, for example by a Bluetooth profile, or using a conventional wired connection. Furthermore in some embodiments the apparatus comprises a speaker output or integrated speakers from which the audio signal is output.

It would be appreciated that the schematic structures described in FIGS. 4, 6, 9, and 11 and the method steps in FIGS. 5, 7, 8, 10, 12 and 13 represent only a part of the operation of a complete audio processing chain comprising some embodiments as exemplarily shown implemented in the electronic apparatus shown in FIG. 1.

As discussed previously automatic volume levelling is where the volume or loudness level of a series of audio or audio from audio-video tracks are normalised such that the disparity in level across tracks is reduced.

Figure 2:
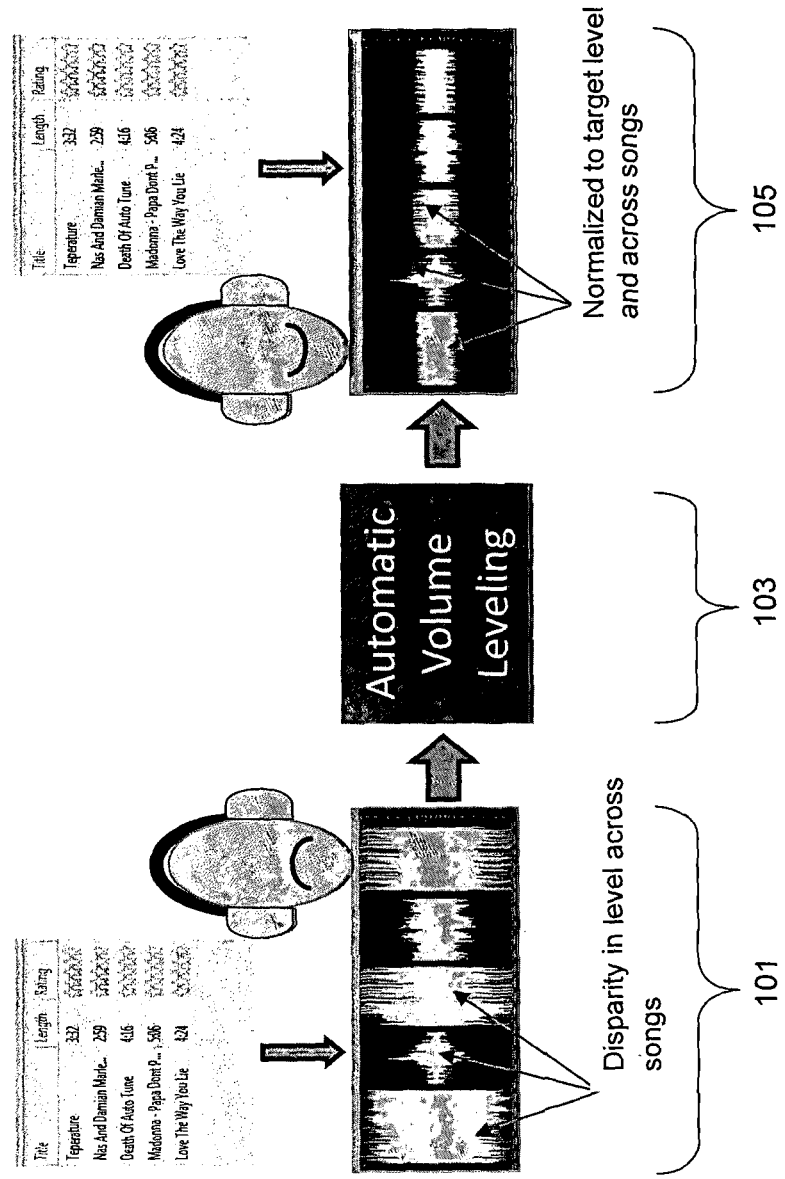
FIG. 2 shows schematically an automatic volume levelling system.

With respect to FIG. 2 an example of automatic volume levelling is shown. Automatic volume levelling can occur for example where a playlist or queue of audio tracks is selected in an audio player such as shown in FIG. 2. The audio tracks selected can have a significant disparity in loudness level as shown by the loudness trace 101 where the first, third and fifth tracks are 'loud' and the second and fourth tracks are 'soft' or 'quiet' tracks. The audio tracks can be processed by an automatic volume levelling processor 103 to output a series of tracks where the loudness or volume levels are normalised with respect to each other and to a target level across the tracks such as shown by the loudness trace 105, where all five tracks have a loudness level close to each other and which would produce a more acceptable listening experience.

Figure 3:
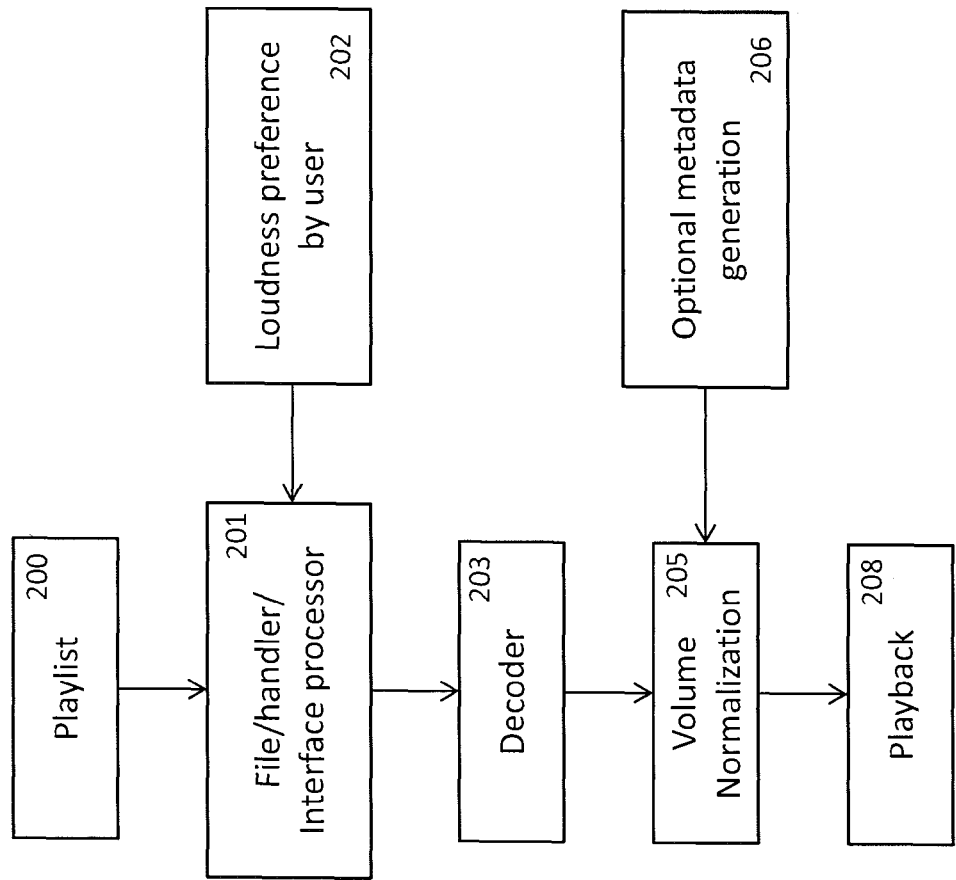
FIG. 3 shows a flow diagram of the operation of an automatic volume levelling system.

An example of an automatic volume levelling system is further shown in FIG. 3. The selected playlist input 200 can be a user interface selection of audio tracks to be output and is input into a file/handler/interface processor 201. The file/handler/interface processor 201 furthermore can be configured to receive a loudness preference input 202 indicated by the user for example also via the user interface. The loudness preference input 202 can for example be a physical volume dial, virtual volume dial, or volume buttons implemented on a touch screen interface. The file/handler/interface processor 201 can be configured to determine which files or audio tracks are to be selected from the playlist input 200. These selected files or audio tracks can be passed to a decoder 203. Furthermore in some examples the file/handler/interface processor 201 can by using a lookup table retrieve metadata associated with the selected file. The metadata can for example in some embodiments be stored on a separate file or stream associated with and stored alongside the audio data within a metafile or be retrieved from a remote network metadata server. The metadata, having been generated offline, is able to indicate to the automatic volume levelling volume normalisation processor the loudness of the audio file. For example the metadata may comprise a data stream of loudness values on an audio track frame by frame basis.

The decoder 203 can process the compressed file audio data to generate a suitable audio signal and pass the uncompressed audio signal to the volume normalisation processor 205 together with any decoded/received metadata.

The volume normalisation processor 205 can the furthermore process the decoded audio signal with the metadata information to normalise the volume to the target level. In some circumstances the volume normalisation can also output operational metadata 206 associated with the audio track to be output as well as providing the audio playback 208.

The use of metadata to normalise the audio track not only requires generation of extra information to be generated offline or available at the time of playback but the generation of the loudness metadata can be computationally expensive in terms of the algorithm required to meter and control loudness. The use of metadata also requires that any additions or deletions or editing to the playlist or queue requires the appropriate editing to the metadata associated with the audio files to prevent auto-levelling errors occurring. For example a deletion or order change in the playlist of audio tracks but not the associated metadata would generate an incorrect normalisation procedure.

The concept of the application is one where the volume or loudness levelling does not require metadata during playback and furthermore does not require offline processing even where the playlist is modified.

Furthermore the concepts related to the application do not require the implementation of conventional loudness estimation models which are computationally complex. The normalisation applied in embodiments of the application use a simpler but effective process to estimate the perceived loudness to achieve the goal of levelling volumes across tracks or songs in a playlist or queue.

The application furthermore in concept uses a multivariable regression approach to estimating perceived loudness levels. The regression coefficients used in such embodiments can be obtained in some embodiments with offline training. The regression based approach thus allows the whole automatic levelling process to be flexible, for example the choice of regression coefficients can be adapted to the statistics of the audio signals and used to assist and improve the levelling performance further.

In some embodiments regression model adequacy checks can be incorporated to further enhance the performance of the automatic volume levelling process by improving the accuracy of loudness prediction. It would be understood that various regression model methods can be employed in some embodiments such a non-linear transformation functions applied (i.e. a log, exponential or polynomial function) to the data for these purposes. In the embodiment described herein a log transformation has been shown.

Furthermore the loudness estimation algorithms as applied in some embodiments of the application use a 5 band warped filter bank and as described herein a multi-variable regression approach. Furthermore in the embodiments described herein statistical interference techniques are used to make decisions about the normalisation of audio levels for a frame of audio.

In some embodiments a constant gain can be applied to a frame based on the decision to normalise and apply a gain. Furthermore it will be seen that in some embodiments of the application the gain value to be applied to the immediate neighbourhood of songs can be adapted to the loudness and not just based on the level the user specifies. For example the gain value can be altered by modifying the target level of playback based on a past audio sample or a specific audio sample.

Figure 4:
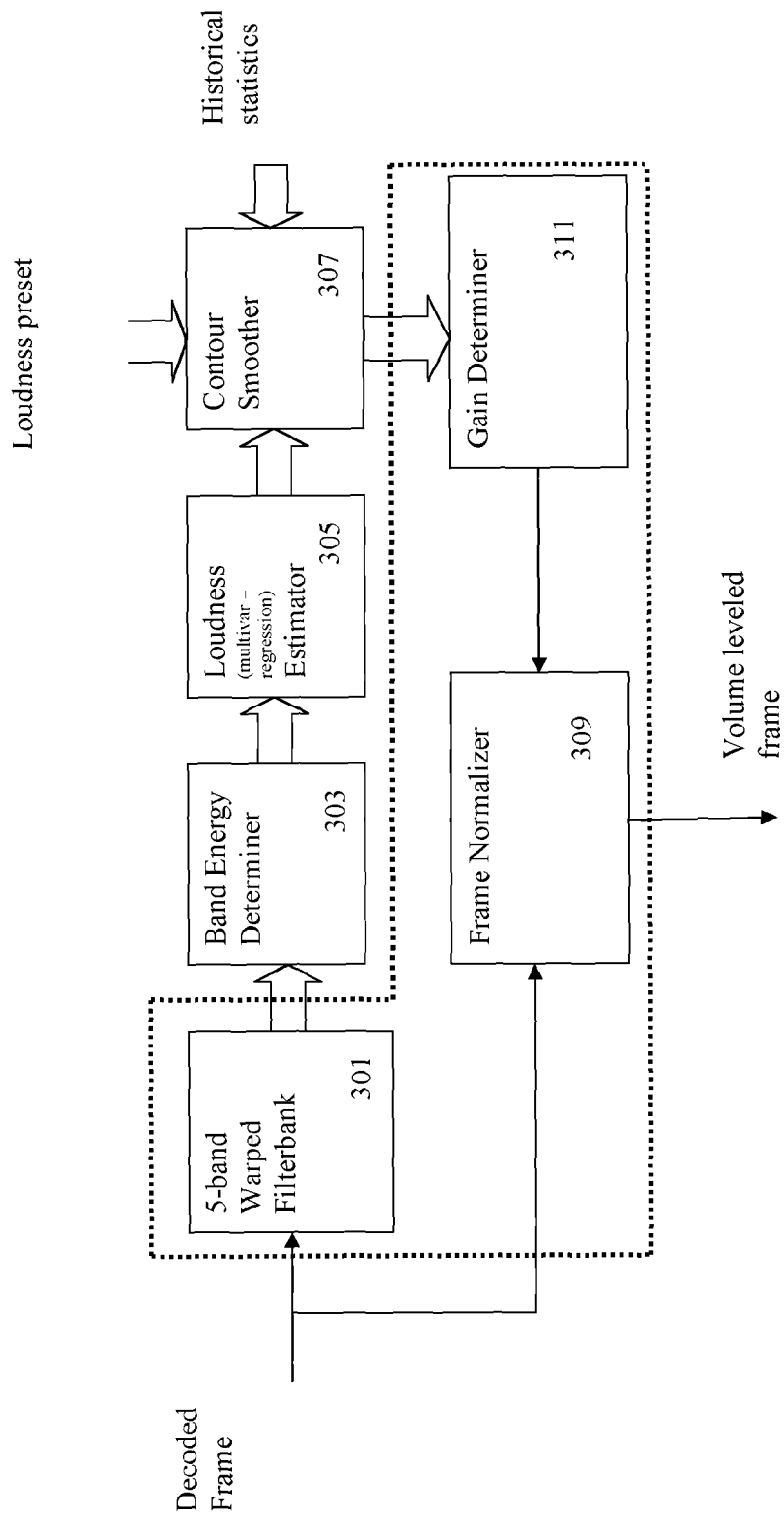
FIG. 4 shows schematically an automatic volume levelling apparatus according to some embodiments of the application.

With respect to FIG. 4 an example automatic volume level apparatus is shown according to some embodiments of the application.

The automatic volume level apparatus can in some embodiments comprise a 5 band warped filter bank 301. The 5 band warped filter bank 301 can be configured to generate from the received decoded frame information 5 separate filtered signals. The audio signals received can in some embodiments be received on a frame by frame basis of 1024 samples each frame being 22 ms long. It would be understood that the frame length, both in terms of the number of samples and time can be dependent on original encoded audio signal and/or the output configuration of the decoder.

The filtered signals can then be passed for further processing in some embodiments to the band energy determiner 303.

Figure 5:
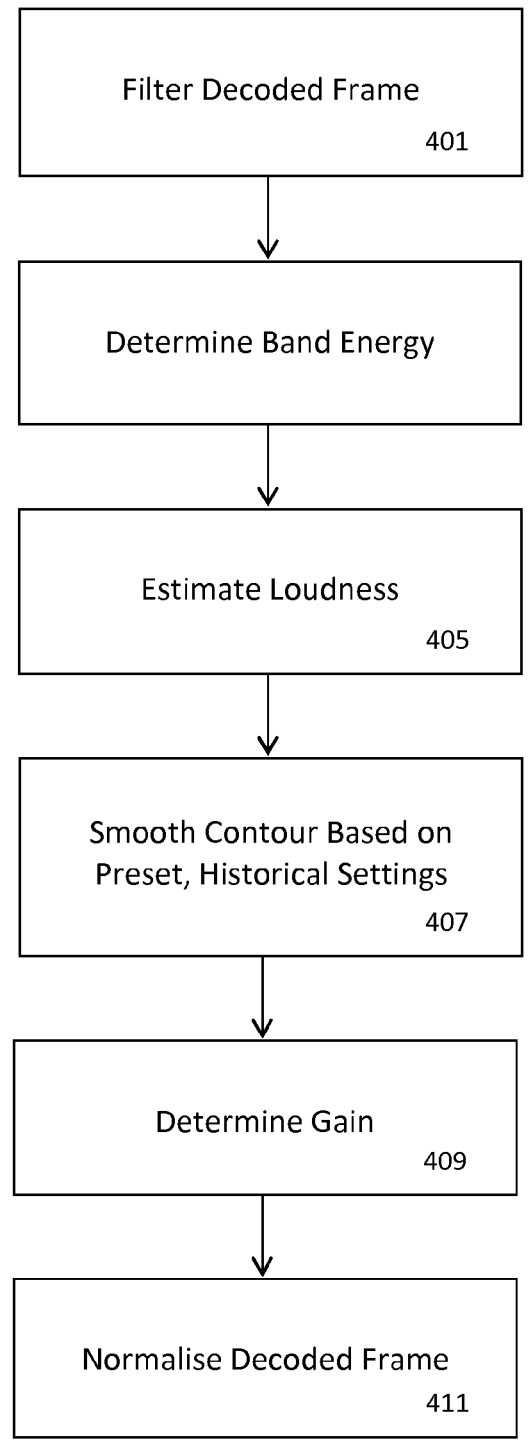
FIG. 5 shows a flow diagram of the operation of the automatic volume levelling apparatus according to some embodiments of the application.

The operation of filtering the decoded frames is shown in FIG. 5 by step 401.

Figure 6:
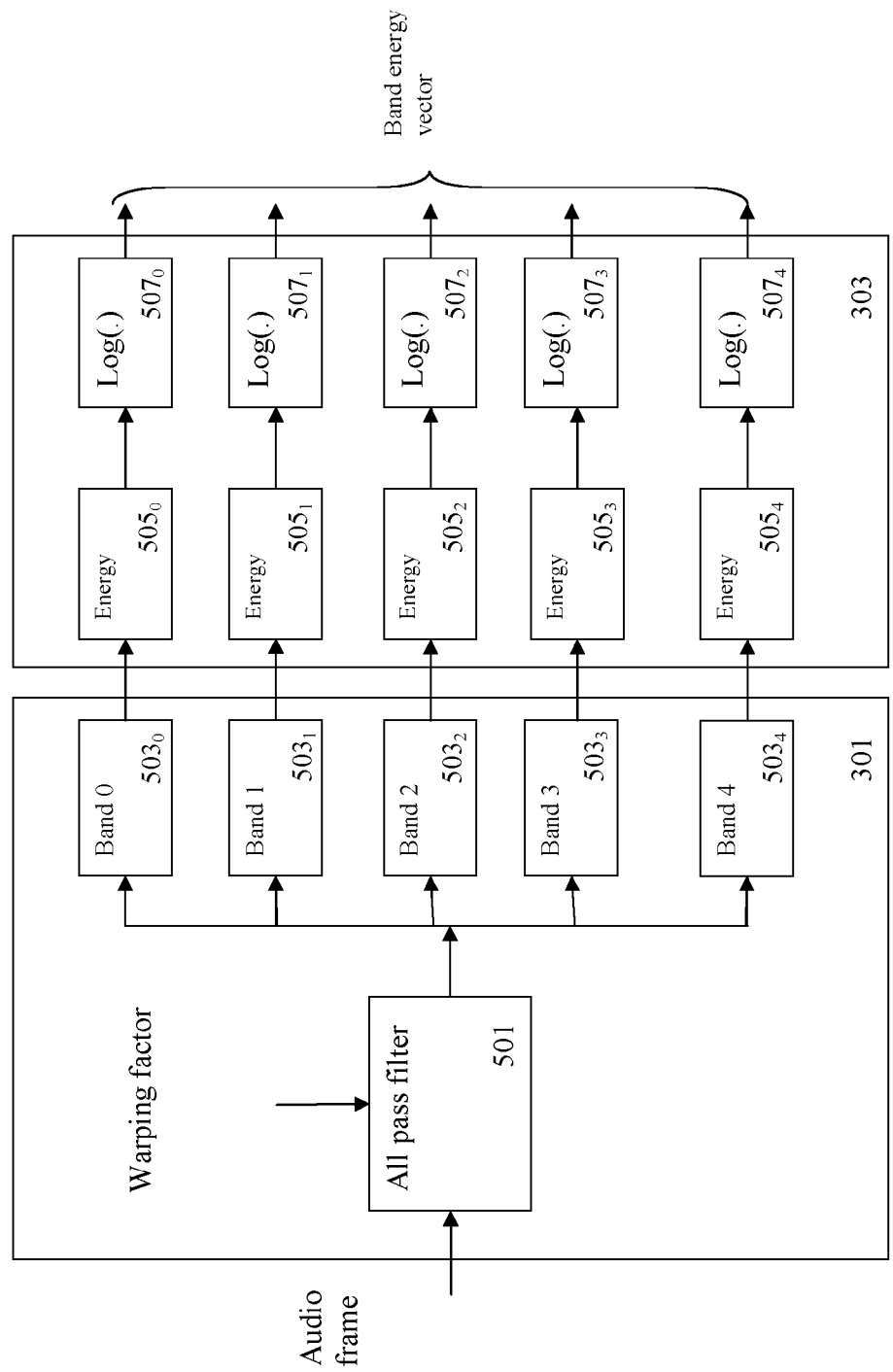
FIG. 6 shows schematically a warped filter bank and band energy determiner as shown in FIG. 4 in further detail according to some embodiments of the application.

With respect to FIG. 6 the 5 band warped filter bank 301 is shown in further detail. Furthermore with respect to FIG. 7 the operation of the 5 band warped filter bank 301 is described in further detail.

The 5 band warped filter bank 301 in some embodiments comprises an all pass filter 501. The all pass filter 501 can be configured to receive the decoded audio frame time domain signal, and a warping factor input and output the warped all pass filter output to a series of band pass filters.

Figure 7:
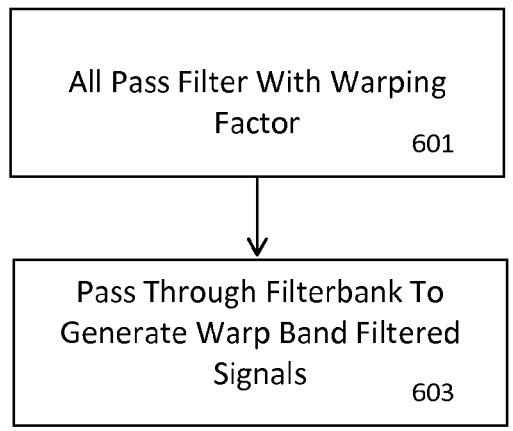
FIG. 7 shows a flow diagram of the operation of the warped filter bank according to some embodiments of the application.

The operation of using an all pass filter with warping factor on the decoded audio frame is shown in FIG. 7 by step 601.

In some embodiments the 5 band warped filter bank 301 comprises 5 separate band pass filters. In the example described herein there are 5 band filters configured to generate 5 bands of audio signals however in some embodiments of the application there can be more than or fewer than 5 bands.

Each band pass filter comprises a filter with differing band widths positioned at different centre frequencies. In some embodiments these filter bands can approximate to the human auditory system for example the filter bank can represent an equivalent rectangular band (ERB) or bark psychoacoustic filter bank. Thus in some embodiments the 5 band warped filter bank 301 comprises a first band filter (band 0) 505$_0$, a second band filter (band 1) 503$_1$, a third band filter (band 2) 503$_2$, a fourth band filter (band 3) 503$_3$ and a fifth band filter (band 4) 503$_4$. In the example shown herein each of the band filters can be considered to be operating in parallel with each other however it would be understood that in some embodiments the processing can be carried out either partially in parallel or in a time division multiplexed manner using the same processing element.

Each band filter can output the resulting band passed audio signal to the band energy determiner 303.

Furthermore the operation of passing the all pass filter output through a filter bank to generate warped band filtered signals is shown in FIG. 7 by step 603.

In some embodiments the automatic volume levelling apparatus comprises a band energy determiner 303. The band energy determiner 303 is configured to receive the output of the band warped filter bank 301 and generate a band energy value for each of the band filtered audio signals.

The operation of determining the band energy is shown in FIG. 5 by step 403.

With respect to FIG. 6 an example band energy determiner 303 is also shown in further detail. The operation of the example band energy determiner 303 is shown in further detail with respect to FIG. 8. In the example shown herein each of the band filtered audio signals are band energy processed as a separate processing stream operating in parallel with each other however it would be understood that in some embodiments the processing can be carried out either partially in parallel or in a time division multiplexed manner of the same processing element.

In some embodiments the band energy determiner 303 comprises a series of energy determiner processors 505 configured to generate the squared sum of the band output for each band.

For example for a 5 band configuration such as shown in FIG. 6 the band energy determiner 303 comprises a first energy determiner processor 505$_0$ configured to process band 0 audio signal data and determine the band 0 energy level, a second energy determiner 505$_1$ configured to process band 1 audio signal data and determine the band 1 energy level, a third energy determiner 505$_2$ configured to process band 2 audio signal data and determine the band 2 energy level, a fourth energy determiner 505$_3$ configured to process band 3 audio signal data and determine the band 3 energy level, and a fifth energy determiner 505$_4$ configured to process band 4 audio signal data and determine the band 4 energy level.

The output of each energy determiner can be passed to an associated log processor 507.

Figure 8:
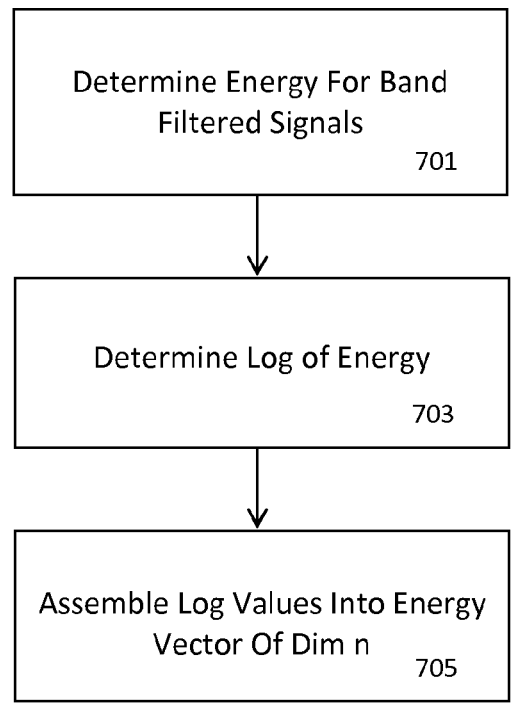
FIG. 8 shows a flow diagram of the operation of the band energy determiner according to some embodiments of the application.

The operation of determining the energy for the band filtered signals is shown in FIG. 8 by step 701.

In some embodiments the band energy determiner 303 comprises a log determiner 507. The log determiner 507 can be configured to generate the log transformed value of the energy value output by the energy determiner 505.

Thus in some embodiments, for the 5 band example shown in FIG. 6, the band energy determiner 303 comprises a first log processor 507$_0$ configured to process the energy values of the band 0 data, a second log processor 507$_1$ configured to process the energy values of the band 1 data, a third log processor 507$_2$ configured to process the energy values of the band 2 data, a fourth log processor 507$_3$ configured to process the energy values of the band 3 data and a fifth log processor 507$_4$ configured to process the energy values of the band 4 data.

The operation of determining the log of the energy values is shown in FIG. 8 by step 703.

The output of the log values can in some embodiments be output as a vector of dimension n where n is equal to the number of bands, which in this example n=5.

The operation of assembling the log values into an energy vector of dimension n is shown in FIG. 8 by step 705.

It would be appreciated that in some embodiments where there are more than or fewer than 5 bands there can be more than or fewer than 5 energy determiner and log processor elements and furthermore the vector dimension can be more than or less than 5.

Furthermore it would be understood that in some embodiments operators other than a log operator can be implemented. In such embodiments any suitable transform can be implemented to replace the log transform. For example in some embodiments the log processor can be replaced by a signal processor configured to implement a general transformation such as a Box-Cox transform. A suitable transformation applied to a signal would be performed to improve the regression performance.

It would be understood that the band energy determiner can be configured to determine band energy values for each frequency range in any suitable manner. For example in some embodiments a generic processor can generate the energy values by determining a sum of the absolute values.

Furthermore it would be appreciated that in some embodiments the filtering and the energy determination can in some embodiments be performed with respect frequency domain representations of the audio signals.

In some embodiments the automatic volume leveller apparatus comprises a loudness estimator 305. The loudness estimator is configured to receive the determined band energy values and generate a loudness estimate for the frame based on the energy values.

The operation of estimating the loudness value is shown in FIG. 5 by step 405.

Figure 9:
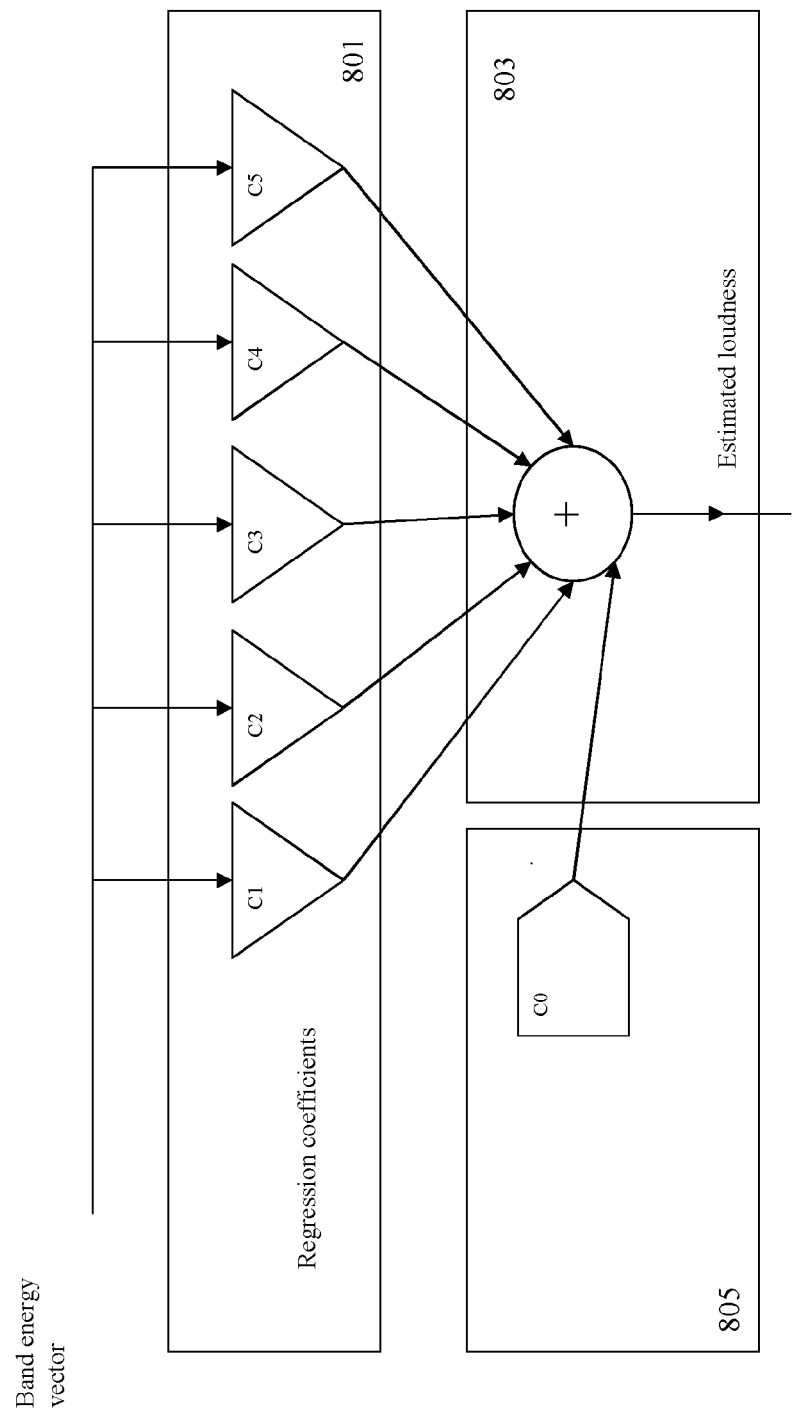
FIG. 9 shows schematically a loudness estimator as shown in FIG. 4 according to some embodiments of the application.

With respect to FIG. 9 an example of the loudness estimator 305 according to some embodiments of the application is shown. Furthermore with respect to FIG. 10 the operation of the loudness estimator 305 shown in FIG. 9 is further described.

The loudness estimator 305 in some embodiments comprises a regression amplifier bank 801, 805. The regression amplifier bank 801 is configured to apply a series of regression coefficients to the band energy vector received from the band energy determiner 303. Thus for example the band energy vector is split into its 5 component fields and each field is multiplied by an associated regression coefficient. In other words each band energy is multiplied by a regression coefficient. The coefficients are determined in some embodiments by off line training. The training can be implemented in some embodiments by determining band energy values for various files in a playlist. Furthermore in some embodiments true loudness estimates are generated using well known models of loudness estimation. Coefficient estimation is implemented in some embodiments by finding regression relationships between true loudness and the band energies as a multivariate regression technique. In some embodiments the regression coefficients are pre-computed regression coefficients configured to determine the estimated loudness for one frame. The regression coefficients can thus in some embodiment be adapted to the sound pressure level (SPL) level of the input frame and to other relevant statistics of the frame to further improve the performance. However in some embodiments only single set of coefficients are used (and hence not adapted to the frame). In some embodiments the regression coefficients can be based on criteria based modelling. Where for example some criteria associated with the audio signal is used to select an example series of regression coefficients. For example different regression coefficients are implemented dependent on the genre of the music in the play list, for example a first set for pop, a second set for rock, etc.

Figure 10:
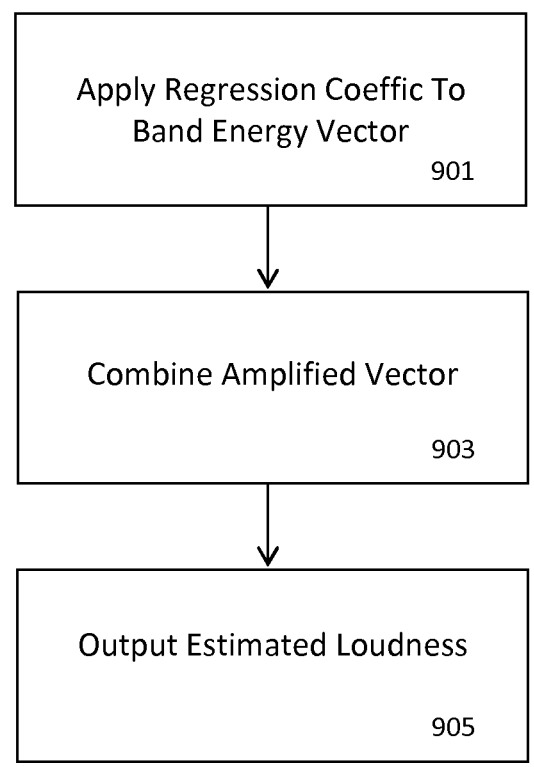
FIG. 10 shows a flow diagram of the operation of the loudness estimator according to some embodiments of the application.

The application of the regression coefficients to the band energy vector values is shown in FIG. 10 by step 901.

The regression coefficient processor 801 outputs the band energy vector multiplied by the regression coefficient values and the further constant regression value 805 is output to a combiner 803. The output of the combiner 803 generates an estimated loudness value.

The combination of the amplified vector is shown in FIG. 10 by step 903.

The estimated loudness value can then be passed to a contour smoother 307.

The operation of outputted the estimated loudness value is shown in FIG. 10 by step 905.

In some embodiments the automatic volume level processor can further comprise a contour smoother 307. The contour smoother is configured to smooth the rapidly varying loudness values across frames. A smoothed estimate of the loudness can be obtained based on the past frames of the estimated loudness. The smoothing furthermore can be carried out in embodiments of the application by combining gain factor and statistical inference. The operation of smoothing the contour is shown in FIG. 5 by step 407. Furthermore in some embodiments the contour smoother can be configured to determine a pre-set or desired level to which the audio signals are to be normalised or levelled. In some embodiments the desired level can be input to the apparatus via a user interface, or can be determined from an initial audio track loudness level, or can be determined by a desired level value stored in a memory. In some embodiments the desired level can be compared to the determined smoothed loudness estimate and the comparison passed to the gain determiner to be used to determine a level by which the audio signal can be adjusted, in other words normalised within a range defined by the desired level value.

Figure 11:
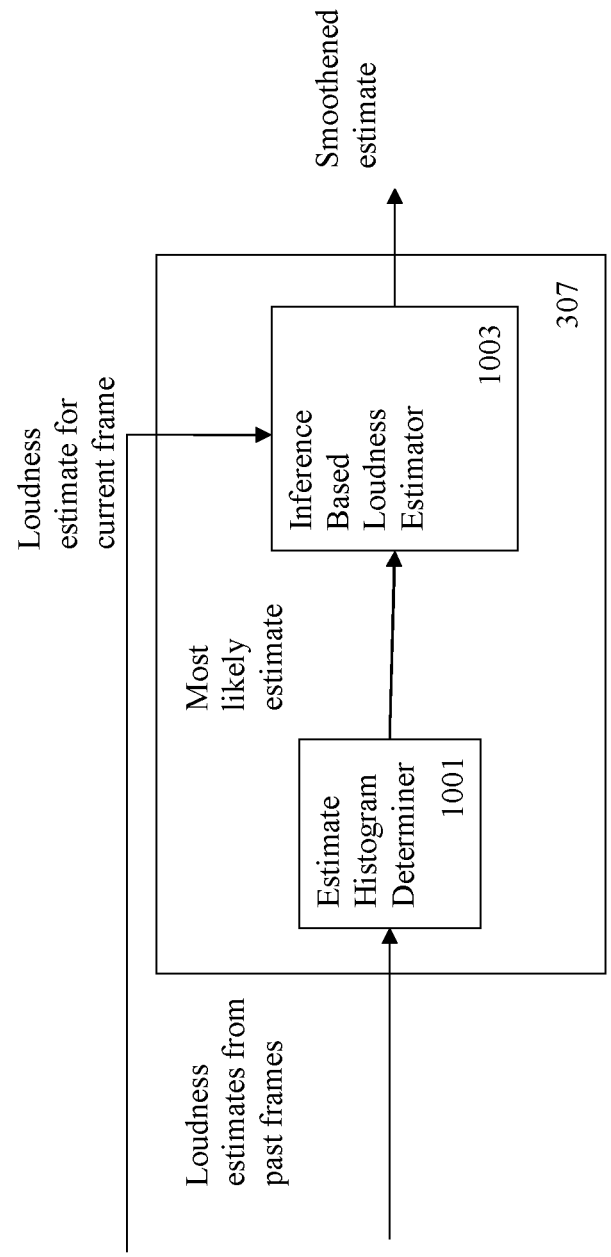
FIG. 11 shows schematically a contour smoother as shown in FIG. 4 according to some embodiments of the application.

A contour smoother 307 is shown in further detail with respect to FIG. 11. Furthermore the operation of the contour smoother can be shown with respect to FIG. 12.

The contour smoother 307 in some embodiments comprises an estimate histogram determiner 1001. The estimate histogram determiner 1001 can be configured to receive the loudness estimates from past frames. For example from a vector of estimated loudness for N (where N can be typically 25-30 or about 550 ms to 700 ms duration) previous frames.

In some embodiments the histogram can be determined with specified set of level intervals (this is algorithm tuning parameter—the set of levels to which the frame's estimated loudness would be categorized to). This is performed in order to ensure the frame-by-frame variation is not too rapid.

Figure 12:
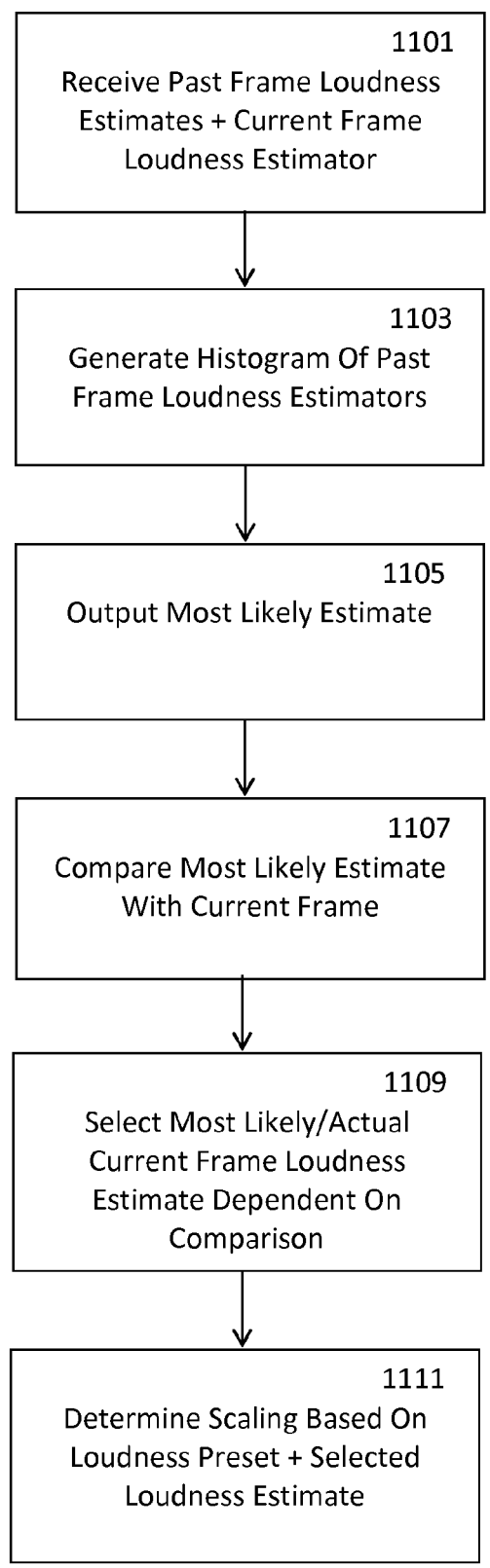
FIG. 12 shows a flow diagram of the operation of the contour smoother according to some embodiments of the application.

The operation of receiving past frame loudness estimates is shown in FIG. 12 by step 1101.

The estimate histogram determiner 1001 can then furthermore generate a histogram of past frame loudness estimates.

The operation of generating a histogram of past frame loudness estimates is shown in FIG. 12 by step 1103.

The estimate histogram determiner 1001 can then be further configured to output the most frequently occurring loudness value or most likely estimate value to an inference based loudness estimator 1003.

The output of the most likely estimate candidate is shown in FIG. 12 by step 1105.

In some embodiments the contour smoother 307 can further comprise an inference estimator 1003. The inference based loudness estimator 1003 is in some embodiments configured to base the loudness estimate on the current frame estimate and the most likely estimate and generate a smoothed estimate or scaling value.

The inference based loudness estimator 1003 can in some embodiments be configured to compare the most likely estimate received from the estimate histogram determiner 1001 and the loudness estimate for the current frame.

In some embodiments this comparison can be a process wherein the most likely estimate received from the estimated histogram determiner 1001 is used as a hypothesis value tested within a 5% significance level using a probability distribution of a heavy tailed normal distribution with appropriate degrees of freedom based on the number of previous frames used.

It would be understood that in some embodiments other hypothesis test thresholds and suitable distribution models can be used.

The operation of comparing the most likely estimate with the current frame estimate is shown in FIG. 12 by step 1107.

Where the hypothesis is accepted the loudness value is kept as the most frequently occurring one (most likely estimate). Otherwise the inference based loudness estimator 1003 can be configured to select the actual frame loudness estimate together with a 'forgetting factor'. The forgetting factor is in some embodiments a low pass filter. As the estimated loudness may vary significantly on a frame-by-frame basis, the estimated loudness for a given frame can in some embodiments be computed as a weighted combination of current and past loudness estimates. The forgetting factor as described in such embodiments can provide an indication of how many past values are used in the filter. For example in a recursive equation implementation in some embodiments the loudness for Frame number K=alpha*current estimate+(1−alpha)*Loudness for Frame number K−1 where alpha is the forgetting factor.

It would be understood that the selection either the most likely of the actual current frame loudness estimate brackets the output loudness estimate within a predetermined range.

The selection of either the most likely or the actual current frame loudness estimate dependant on the comparison is shown in FIG. 12 by step 1109.

It would be understood although a parametric estimation is performed in the example described herein in some embodiments a non-parametric estimation process can be implemented. Non-parametric estimation procedure would be based on modelling the actual probability density functions of the loudness values, rather than assuming the distributions to be either normal or heavy tailed normal distributions.

Based on the loudness estimate selected the scaling factor based on the loudness pre-set and the selected loudness estimate can then be determined by the inference based loudness estimator 1003. In some embodiments the forgetting factor can be applied to the scaling.

The operation of determining the scaling based on the loudness pre-set and the selected loudness estimate is shown in FIG. 12 by step 1111.

The contour smoothed estimate scaling value can then be passed to a gain determiner 311.

In some embodiments the automatic volume levelling processor can comprise a gain determiner 311. The gain determiner is configured to generate a suitable gain value which can be output to a normaliser for volume levelling processing (normalising).

The operation of determining the gain is shown in FIG. 5 by step 409.

The gain determiner 311 can be configured in some embodiments to receive a scaling factor and from the scaling factor determine a gain value or level value to be passed to a frame normaliser 309 or audio signal adjuster.

Figure 13:
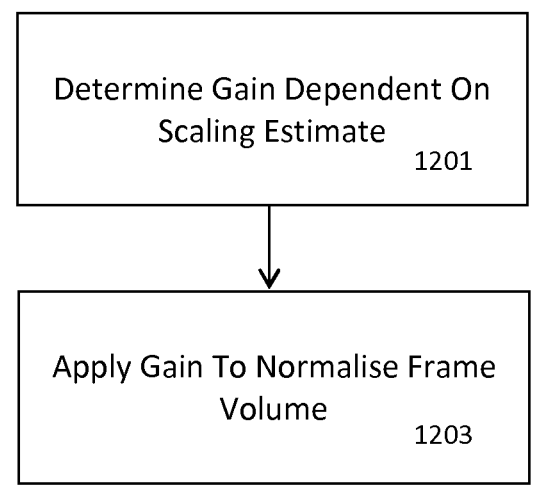
FIG. 13 shows a flow diagram of the operation of a gain determiner and frame normalizer according to some embodiments of the application.

The operation of determining the gain value dependant on the scaling estimate is shown in FIG. 13 by step 1201.

The frame normaliser 309 can in some embodiments be configured to receive the decoded frame and the gain determined value from the gain determiner 311 and output a volume levelled frame value based on the gain or level value determined based on the loudness estimate of the audio signal and furthermore in some embodiments dependent on the desired level value.

The application of the gain to normalise the frame volume is described with respect to FIG. 13 in step 1203.

The operation of normalising the decoded frame is shown in FIG. 5 by step 411.

Figure 14:
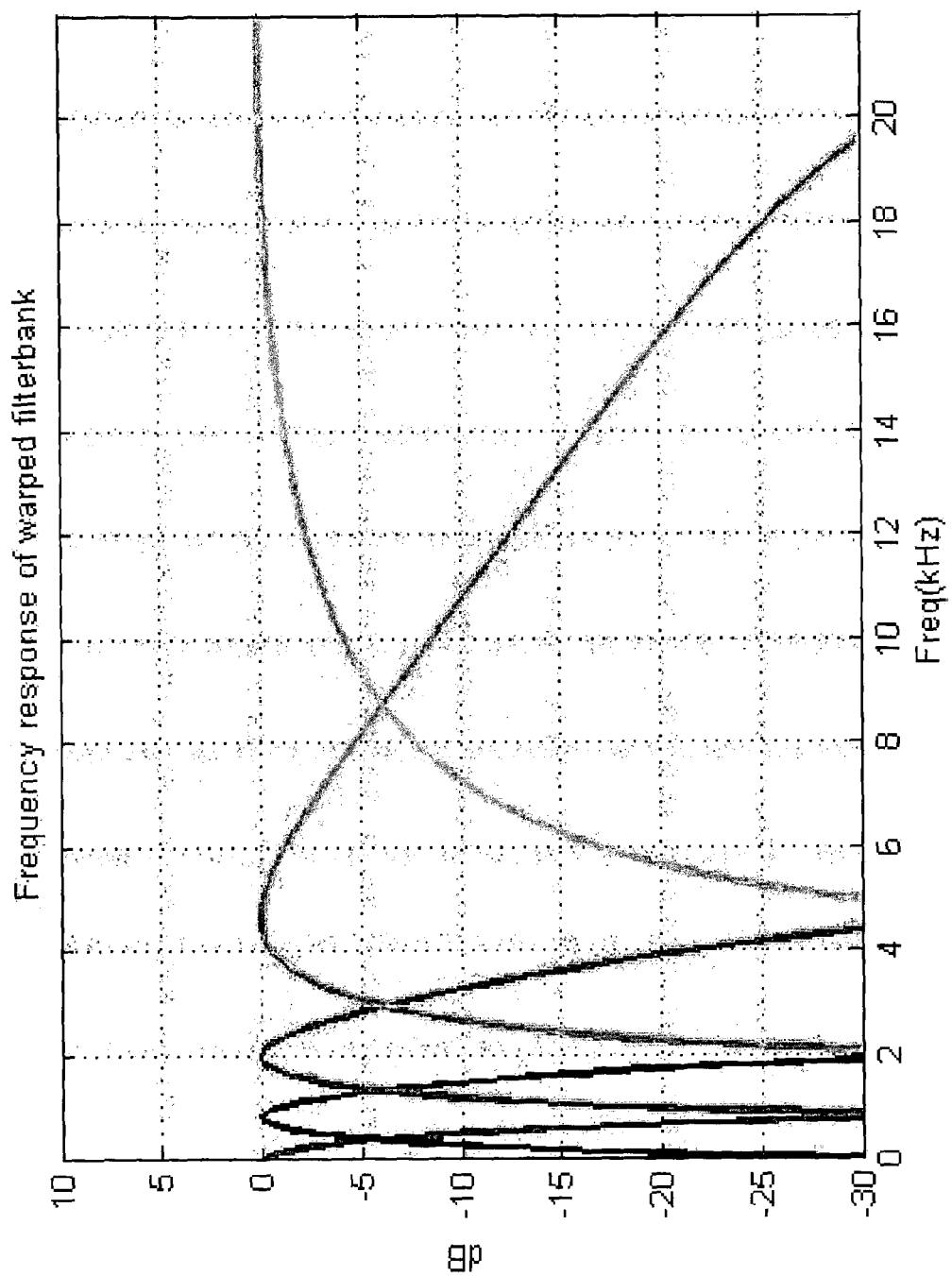
FIG. 14 shows an example frequency response of a warped filter bank.

With respect to FIG. 14 an example series of frequency response values for a warped filter bank is shown wherein the first filter bank is configured to have a peak at approximately 0 Hz, a second filter bank at approximately 700 Hz, a third filter bank at 2 kHz, a fourth filter bank at 4.2 kHz and a fifth filter bank at a frequency of 20 kHz.

Figure 15:
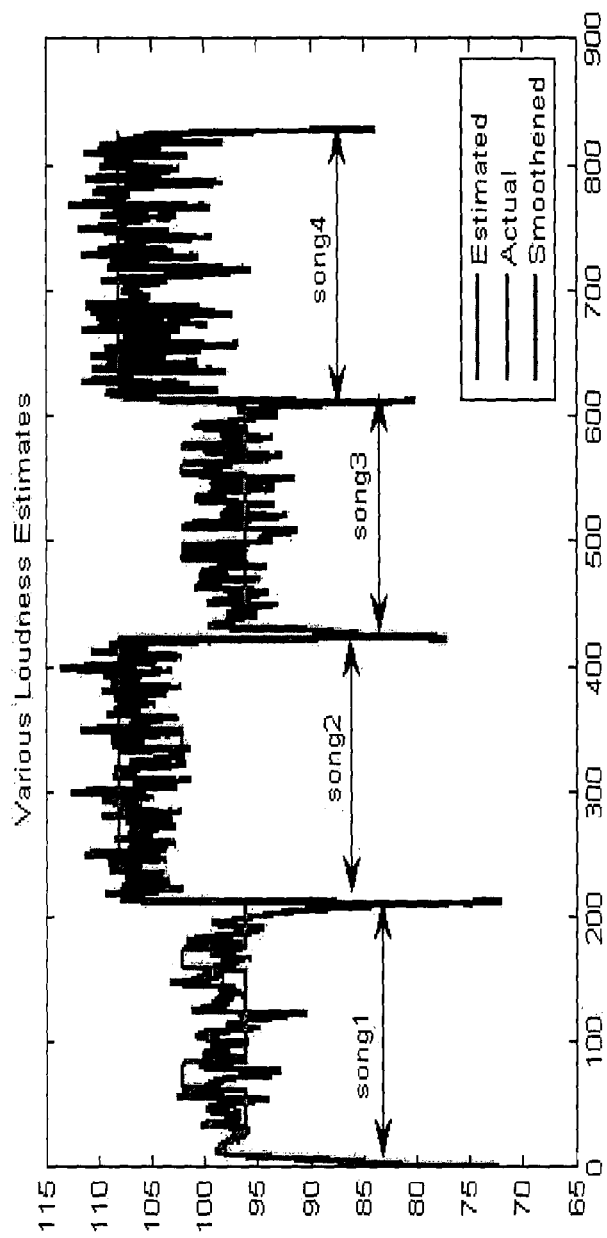
FIG. 15 shows a loudness estimation plot for an example selection of audio files.

With respect to FIG. 15 an example loudness estimate trace of a sequence of songs is shown showing an estimated, actual and smoothed sequence of values. The performance of regression approach to estimate the loudness is visible in. The figure shows three trends super-imposed on each other. The first curve is a loudness estimate for each frame of the songs in the playlist computed using an elaborate Moore-Glasberg's loudness model. The second curve is loudness estimate obtained by regression approach used in embodiments of the application, while the third curve is a smoothened loudness profile that can in some embodiments be used to estimate the gain factor for normalization. It can be seen from the Figure that the regression based estimates follow the actual estimates quite closely, with the advantage that the embodiments of the application are relatively inexpensive in terms of computation processing.

In some embodiments for the initial frames in the audio signal, for example the first 25-30 frames normalization is applied as a linear increasing ramp signal. For this duration measurement and control can be bypassed and/or disabled because of unavailability of sufficient statistics to get a reliable estimate. In such embodiments the transition to the target level is gradual rather than abrupt. In some embodiments a linear ramp function is used to increase to create gradual increase in volume level over the first 25 frames.

It would be understood that although the embodiments described refer to a mono signal that embodiments can be applied to stereo and further multi-channel audio signals. For example modifications to extend volume levelling to stereo can in some embodiments be as follows:

Compute band energies for each of the two channels.

Compute average energy across the two channel for each of the five bands Estimate loudness based on the average of two bands. Use the estimated loudness to compute common normalization factor which would be then applied to both the channels.

In such examples by computing a common normalization factor for both channels prevents inter aural level differences getting disturbed and hence ensuring that spatial impression in the stereo is not impacted.

The advantages of such embodiments of the application are that the approach requires no metadata for normalizing loudness of songs in a playlist. Loudness normalizing can happen dynamically. Furthermore application of the algorithm can also generate metadata and loudness normalization can if required be performed offline.

Furthermore it would be understood that embodiments of the application perform a computationally inexpensive but effective algorithm that can dynamically adjust the loudness levels automatically.

It would furthermore be understood that regression is only one approach to estimating loudness. There can in some embodiments be alternative statistical functions applied that map the band energies to a loudness estimate, these can be further examined and quality of normalization could be improved further. An accurate metric of loudness is not prerequisite, here since normalization the perceived level of the audio file is the objective.

The embodiments of the application are suitable to be hosted on device as it can perform volume levelling with very little apriori information. Only information it needs is estimated loudness from previous frames in the audio files. However if required the algorithm can also run offline and normalize a set of files.

Although the above examples describe embodiments of the invention operating within an electronic device 10 or apparatus, it would be appreciated that the invention as described below may be implemented as part of any audio processor. Thus, for example, embodiments of the invention may be implemented in an audio processor which may implement audio processing over fixed or wired communication paths.

Thus user equipment may comprise an audio processor such as those described in embodiments of the invention above.

It shall be appreciated that the term electronic device and user equipment is intended to cover any suitable type of wireless user equipment, such as mobile telephones, portable data processing devices or portable web browsers.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

Thus at least some embodiments may be a computer-readable medium encoded with instructions that, when executed by a computer perform: determining a loudness estimate for at least one frame of an audio signal; determining a level value for the at least one frame based on the loudness estimate; and adjusting the audio signal based on the level value.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

As used in this application, the term 'circuitry' refers to all of the following:
(a) hardware-only circuit implementations (such as implementations in only analog and/or digital circuitry) and
(b) to combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone or server, to perform various functions and
(c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A method for loudness leveling of a queue of audio tracks in an audio player comprising:
determining a first loudness estimate for at least one frame of an audio track in the queue, wherein at least two frequency band energy values from the at least one frame of the audio track are generated and an estimated loudness value based on the at least two frequency band energy values for the at least one frame of the audio track is determined;
determining a second loudness estimate for at least one frame of a second audio track in the queue;
comparing the second loudness estimate against the first loudness estimate;
selecting a loudness estimate based on one of the first or second loudness estimate dependent on the comparison;
determining a level value for the second audio track based on the selected loudness estimate; and
adjusting the loudness of the second audio track based on the level value so as to reduce a disparity in loudness level across the first and second audio tracks in the queue.

2. The method as claimed in claim 1, further comprising determining a desired level, and wherein adjusting the second audio track is further based on the desired level.

3. The method as claimed in claim 2, wherein determining a desired level comprises at least one of:
receiving a desired level from a user interface input;
determining a desired level from a selected audio signal; and
receiving a desired level from a memory.

4. The method as claimed in claim 1, further comprising comparing the first frame loudness estimate against at least one historical loudness estimate.

5. The method as claimed in claim 4, further comprising generating an estimate of a distribution model dependent on the at least one historical loudness estimate; and
determining whether the first frame loudness estimate fits within the estimate of the distribution model.

6. The method as claimed in claim 5, further comprising selecting the first frame loudness estimate when the first frame loudness estimate fits within the estimate of the distribution model; and selecting the at least one historical frame loudness estimate when the first frame loudness estimate fails to fit the estimate of the distribution model.

7. The method as claimed in claim 1, wherein determining the first loudness estimate for the at least one frame of the audio track further comprises:
applying a regression coefficient to each of the at least two frequency band energy values; and combining the regression coefficient modified at least two frequency band audio signals to generate a first frame loudness estimate.

8. An apparatus comprising at least one processor and at least one memory storing computer program code, the at least one memory and the computer program code configured to, with the at least one processor, cause the apparatus to at least:

determine a first loudness estimate for at least one frame of an audio track in a queue, wherein at least two frequency band energy values from the at least one frame of the audio track are generated and an estimated loudness value based on the at least two frequency band energy values for the at least one frame of the audio track is determined;

determine a second loudness estimate for at least one frame of a second audio track in the queue;

compare the second loudness estimate against the first loudness estimate;

select a loudness estimate based on one of the first or second loudness estimate dependent on the comparison;

determine a level value for the second audio track based on the selected loudness estimate; and adjust the loudness of the second audio track based on the level value so as to reduce a disparity in loudness level across the first and second audio tracks in the queue.

9. The apparatus as claimed in claim 8, further caused to determine a desired level, and wherein adjusting the second audio track is further based on the desired level.

10. The apparatus as claimed in claim 9, wherein determining a desired level causes the apparatus to perform at least one of:

receive a desired level from a user interface input;
determine a desired level from a selected audio signal; and
receive a desired level from a memory.

11. The apparatus as claimed in claim 8, wherein the first frame loudness estimate is compared against at least one historical loudness estimate.

12. The apparatus as claimed in claim 11, wherein the apparatus further estimates a distribution model dependent on the at least one historical loudness estimate and determines whether the first frame loudness estimate fits within the estimate of the distribution model.

13. The apparatus as claimed in claim 12, wherein the apparatus further selects the first frame loudness estimate when the first frame loudness estimate fits within the estimate of the distribution model.

14. The apparatus as claimed in claim 12, wherein the apparatus further selects the at least one historical frame loudness estimate when the first frame loudness estimate fails to fit the estimate of the distribution model.

15. The apparatus as claimed in claim 8, wherein determining the first loudness estimate for the at least one frame of the audio track further causes the apparatus to:

apply a regression coefficient to each of the at least two frequency band energy values; and combine the regression coefficient modified at least two frequency band audio signals to generate a first frame loudness estimate.

16. A computer program product comprising at least one non-transitory computer-readable storage medium having computer-executable program code instructions stored therein, the computer-executable program code instructions comprising program code instructions configured to:

determine a first loudness estimate for at least one frame of an audio track in a queue, wherein at least two frequency band energy values from the at least one frame of the audio track are generated and an estimated loudness value based on the at least two frequency band energy values for at least one frame of the audio track is determined;

determine a second loudness estimate for at least one frame of a second audio track in the queue;

compare the second loudness estimate against the first loudness estimate;

select a loudness estimate based on one of the first or second loudness estimate dependent on the comparison;

determine a level value for the second audio track based on the selected loudness estimate; and adjust the loudness of the second audio track based on the level value so as to reduce a disparity in loudness level across the first and second audio tracks in the queue.

17. A computer program product according to claim 16 further comprising program code instructions configured to determine a desired level, and wherein adjusting the second audio track is further based on the desired level.

18. A computer program product according to claim 17 wherein the program code instructions configured to determine the desired level comprise program code instructions configured to:

receive a desired level from a user interface input;
determine a desired level from a selected audio signal; and
receive a desired level from a memory.

19. A computer program product according to claim 16, further comprising program code instructions configured to estimate a distribution model dependent on at least one historical loudness estimate and determine whether the first frame loudness estimate fits within the estimate of the distribution model.

20. A computer program product according to claim 16, wherein the program code instructions configured to determine the first loudness estimate for the at least one frame of the audio track comprise program code instructions configured to:

apply a regression coefficient to each of the at least two frequency band energy values; and combine the regression coefficient modified at least two frequency band audio signals to generate a first frame loudness estimate.

* * * * *